US 7,698,482 B2

(12) United States Patent
Venkata et al.

(10) Patent No.: US 7,698,482 B2
(45) Date of Patent: *Apr. 13, 2010

(54) MULTIPLE DATA RATES IN INTEGRATED CIRCUIT DEVICE SERIAL INTERFACE

(75) Inventors: Ramanand Venkata, San Francisco, CA (US); Rakesh H. Patel, Cupertino, CA (US); Chong H. Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 629 days.

This patent is subject to a terminal disclaimer.

(21) Appl. No.: 11/177,007

(22) Filed: Jul. 8, 2005

(65) Prior Publication Data

US 2007/0011370 A1 Jan. 11, 2007

(51) Int. Cl.
*G06F 3/00* (2006.01)
*G06F 5/00* (2006.01)
(52) U.S. Cl. ........................................ 710/60
(58) Field of Classification Search .................... 710/60
See application file for complete search history.

(56) References Cited

U.S. PATENT DOCUMENTS

| | | | | |
|---|---|---|---|---|
| 6,487,620 | B1 * | 11/2002 | Grosshog et al. | 710/107 |
| 6,831,480 | B1 | 12/2004 | Shumarayev et al. | |
| 6,888,376 | B1 * | 5/2005 | Venkata et al. | 326/41 |
| 6,894,530 | B1 | 5/2005 | Davidson et al. | |
| 2001/0036193 | A1 * | 11/2001 | Kori | 370/402 |
| 2004/0068593 | A1 * | 4/2004 | Helenic et al. | 710/71 |
| 2004/0221077 | A1 * | 11/2004 | Yen | 710/100 |
| 2006/0095613 | A1 * | 5/2006 | Venkata et al. | 710/62 |

FOREIGN PATENT DOCUMENTS

EP 1 248 372 10/2002

OTHER PUBLICATIONS

William DeVercelly, Belkin TetraHub Hi-Speed USB 2.0 4-Port Hub, Jun. 7, 2004, http://www.everythingusb.com/hardware/index/Belkin_TetraHub_Hi-Speed_USB_2.0_4-Port_Hub.htm.*
Neal White III, Biostar M7NCG Motherboard, Apr. 28, 2003, http://www.bjorn3d.com/read.php?cID=247.*

(Continued)

*Primary Examiner*—Henry W. H. Tsai
*Assistant Examiner*—Kris Rhu
(74) *Attorney, Agent, or Firm*—Ropes & Gray LLP; Jeffrey H. Ingerman

(57) ABSTRACT

A serial interface for a programmable logic device supports a wide range of data rates by providing a first number of channels supporting a first range of data rates and a second number of channels supporting a second range of data rates. The first range of data rates is preferably lower than the second range of data rates and preferably the first number of channels is higher than the second number of channels which preferably is 1. For backward compatibility with existing devices, the first number of channels in each interface preferably is four. Each channel preferably includes a physical medium attachment module and a physical coding sublayer module. Each of the higher-speed channels in the second number of channels preferably also includes a clock management unit, while the lower-speed channels in the first number of channels preferably share one or more clock management units.

24 Claims, 4 Drawing Sheets

OTHER PUBLICATIONS

Don Jones, USB 2.0 Support in Windows XP: High Speed at Last, Aug. 5, 2002, http://www.microsoft.com/windowsxp/using/networking/learnmore/jones_02august05.mspx.*

Belkin F5U012 USB Express Bus Plus Multi Port Hub, Oct. 15, 1999, http://www.amazon.com/Belkin-F5U012-Express-Serial-Parallel/dp/B00001ZWXB.*

* cited by examiner

MULTIPLE DATA RATES IN INTEGRATED CIRCUIT DEVICE SERIAL INTERFACE

BACKGROUND OF THE INVENTION

This invention relates to a high-speed serial interface, especially in a programmable logic device (PLD), which may operate at different data rates.

It has become common for PLDs to incorporate high-speed serial interfaces to accommodate high-speed (i.e., greater than 1 Gbps) serial I/O standards—e.g., the XAUI (Extended Attachment Unit Interface) standard. In accordance with the XAUI standard, a high-speed serial interface includes transceiver groups known as "quads," each of which includes four transceivers and some central logic.

In one implementation, each transceiver is divided into a physical medium attachment (PMA) portion or module which communicates with outside devices, and a physical coding sublayer (PCS) portion or module which performs serial processing of data, for transmission to, or that is received from, those outside devices. Currently available PMA modules and PCS modules overlap in terms of the data rates that each will support, but the maximum data rate of available PMA modules exceeds the maximum data rate of available PCS modules.

In any event, heretofore the maximum data rate that could be supported in a programmable logic device high-speed serial interface has been about 6 Gbps to about 6.5 Gbps. However, serial communications standards at speeds up to about 10 Gbps have begun to emerge.

It would be desirable to be able to support currently available data rates in a programmable logic device serial interface.

SUMMARY OF THE INVENTION

The present invention accommodates, in a high-speed serial interface of the type described, in a PLD, data transmission and reception at rates up to about 10 Gbps. A full range of data rates is supported by providing, in addition to a known interface capable of a first, lower range of speeds, a separate channel capable of a second, higher range of speeds up to about 10 Gbps. A single interface capable of all speeds up to about 10 Gbps is possible, but because of physical limitations, it is not desirable. First, a higher-speed interface would consume more device area, and may require special isolation which would add still more area. Second, such interfaces are more difficult to build than lower-speed interfaces. Therefore, having an interface all of whose channels support the full range of data rates would not be practical, particularly where many applications would not use the higher data rates. In addition, for those reasons, the separate higher-speed channel preferably has a lowest data rate that is higher than the lowest data rate supported by the lower-speed channels. For example, the higher-speed channel may support data rates between about 4 Gbps and about 10 Gbps.

For compatibility with existing high-speed serial interface architectures and standards, an interface according to the present invention preferably is constructed using the same layout as existing high-speed serial interfaces. In a common existing layout, intended to support at least the aforementioned XAUI standard, a high-speed serial interface has four transceiver channels, as well as a central logic region including a central clock management unit (CMU) including a transmit clock circuit which frequently is a phase-locked loop ("PLL") or delay-locked loop ("DLL"). Each transceiver channel preferably includes one each of a physical medium attachment (PMA) portion or module which communicates with outside devices, and a physical coding sublayer (PCS) portion or module which performs serial processing of data, for transmission to, or that is received from, those outside devices.

Thus, in one preferred embodiment of the present invention, a high-speed serial interface preferably has a lower-speed portion with a central logic area and four lower-speed channel areas. In each of the lower-speed channel areas, there preferably are both a PCS module and a PMA module. These lower-speed channels preferably support operation between about 0.6 Gbps and about 4 Gbps. This embodiment preferably also has a fifth channel, with its own CMU, PCS module and PMA module, for higher-speed operation between about 4 Gbps and about 10 Gbps. The higher-speed fifth channel can be isolated as necessary to support the higher data rates without having to apply the same degree of isolation to, and therefore without increasing the area of, the lower-speed channels, and without having to build four channels each capable of data rates between 0.6 Gbps and 10 Gbps.

Another preferred embodiment of the present invention is similar, but there may be some overlap between the data rates supported by the higher-speed channel and the data rates supported by the lower-speed channels. In such an embodiment, the lower-speed channels may handle data rates up to about 6.5 Gbps. In order to accommodate this, the lowest data rate handled by such channels may be raised from about 0.6 Gbps to about 1 Gbps, although a lowest data rate of 0.6 Gbps remains possible. This arrangement allows mid-range data rates (i.e., those between about 4 Gbps and about 6.5 Gbps) to be handled by the more numerous lower-speed channels, reserving the higher-speed channels for primarily high-range data rates (i.e., those above about 6.5 Gbps), thereby reducing the number of higher-speed channels required.

In the latter embodiment, the PCS for a lower-speed channel would have to be able to handle the increased maximum data rate. One solution is that shown in copending, commonly-assigned U.S. Pat. No. 6,888,376, hereby incorporated by reference herein in its entirety, which discloses a serial interface in which, at higher speeds, two PCS modules are used with each PMA module (with a PMA module corresponding to one of the two PCS modules remaining unused). Another solution is that shown in copending, commonly-assigned U.S. patent application Ser. No. 11/177,034, filed concurrently herewith, and hereby incorporated by reference in its entirety, which discloses a PCS that has two different internal paths for operating in different modes depending on the desired rate.

It will be understood that the present invention, as exemplified by either of the foregoing embodiments, is backward-compatible with existing four-channel 4 Gbps and 6.5 Gbps serial interfaces. It also should be understood that any discussion herein of specific data rates is exemplary only and does not limit the present invention, which can be implemented with other combinations of data rates than those discussed herein. Thus, with regard to data rates, the term "substantially higher," as used herein and in the claims that follow, should be interpreted to mean "at least about 50% higher," and can include "more than 100% higher" or even "150% higher" or more.

Thus, in accordance with the present invention there is provided a serial interface for use in a programmable logic device. The serial interface includes a first number of serial data channels operable over a first range of data rates, and a second number of serial data channels operable over a second range of data rates. Each of the first and second ranges has a respective maximum data rate. The maximum data rate of the second range is substantially higher than the maximum date rate of the first range.

A programmable logic device incorporating such an interface is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides a high-speed serial interface that serves a wide range of data rates by providing a first plurality of channels for lower data rates, and one or more channels for higher data rates. Preferably, there are four lower-speed channels and one higher-speed channel as described above, but other numbers of channels can be provided within the scope of the invention. As also described above, the data rate ranges covered by the different channels can be contiguous or overlapping.

The number of higher-speed channels preferably is lower than the number of lower-speed channels for several reasons. First, as discussed above, the higher-speed channels are more difficult to create and consume more device area. In general, more use is likely to be made of the lower-speed channels than of the higher-speed channels. Not only is there is no reason to expend extra resources to create a large number of channels that are less likely to be used, but it is also logical to provide more of the type of channel that is likely to be used more. In addition, the higher-speed channels generally require more signal traces than the lower speed channels, further increasing the device area consumed. By limiting the number of higher-speed channels, the number of traces on the device is reduced, leaving room for a greater total number of channels.

The invention will now be described with reference to FIGS. 1-3.

Figure 1:
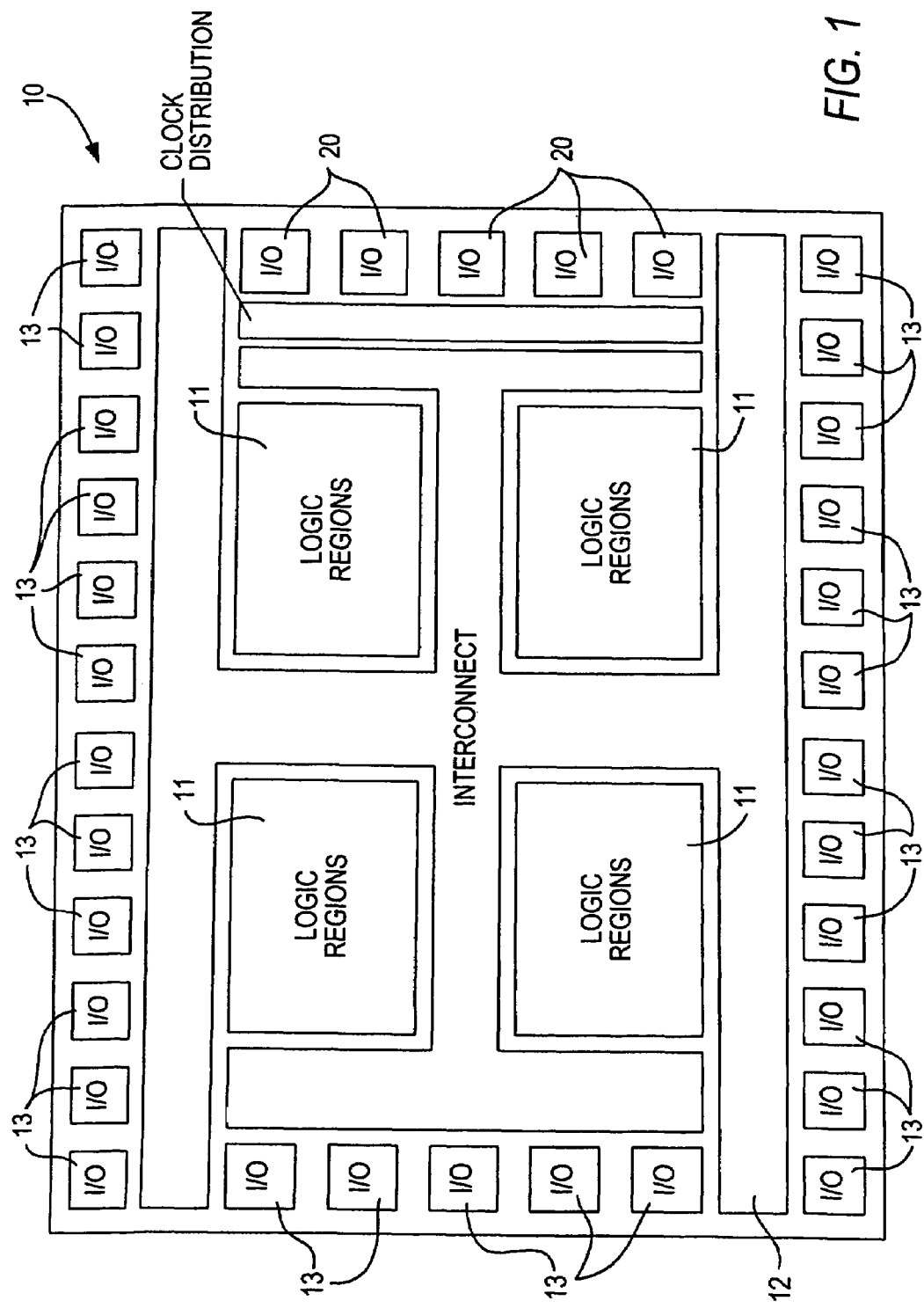
FIG. 1 is a block diagram of a preferred embodiment of a programmable logic device in which the present invention can be used.

PLD 10, shown schematically in FIG. 1, is one example of a device incorporating a serial interface 20 according to the invention. PLD 10 has a programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection.

For example, each I/O region 20 preferably is a high-speed serial interface as described above, similar to an interface capable of implementing the XAUI standard. Thus, as shown in FIG. 2, each interface 20 preferably includes four channels 21-24, each including its own PCS module 25 and PMA module 26. Central logic 27, including at least one clock management unit 270 (in the embodiment shown, two), preferably is shared by channels 21-24. In the embodiment shown, each of channels 21-24 can process data at rates between about 0.6 Gbps and about 4 Gbps. As discussed above, each interface 20 preferably also includes higher-speed channel 200, preferably including PCS module 201 and PMA module 202, as well as its own logic and CMU (shown, by way of example only, as part of PMA 202).

Figure 2:
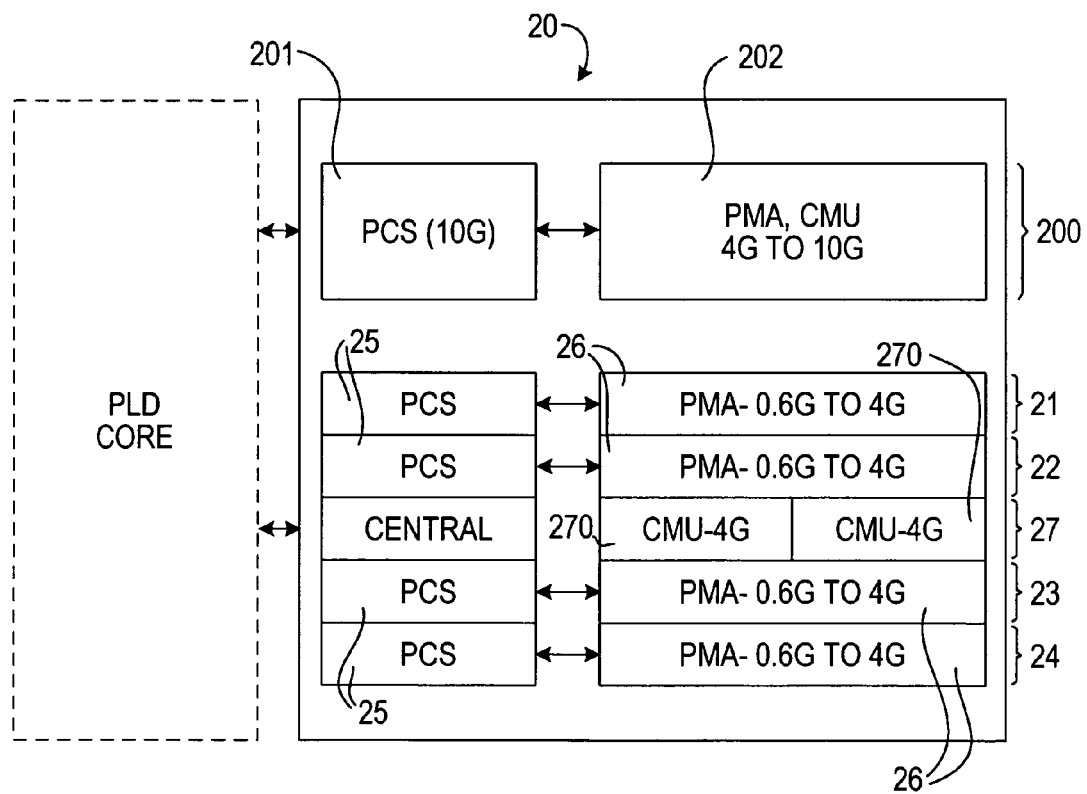
FIG. 2 is a schematic diagram of a first embodiment of a serial interface in accordance with the present invention.

In FIG. 2, the data rate range of interface 20 is between about 0.6 Gbps and about 10 Gbps, with channels 21-24 preferably processing data at data rates between about 0.6 Gbps and about 4 Gbps, and channel 200 preferably processing data at data rates between about 4 Gbps and about 10 Gbps. However, the precise boundaries of the data rate ranges may vary.

Figure 3:
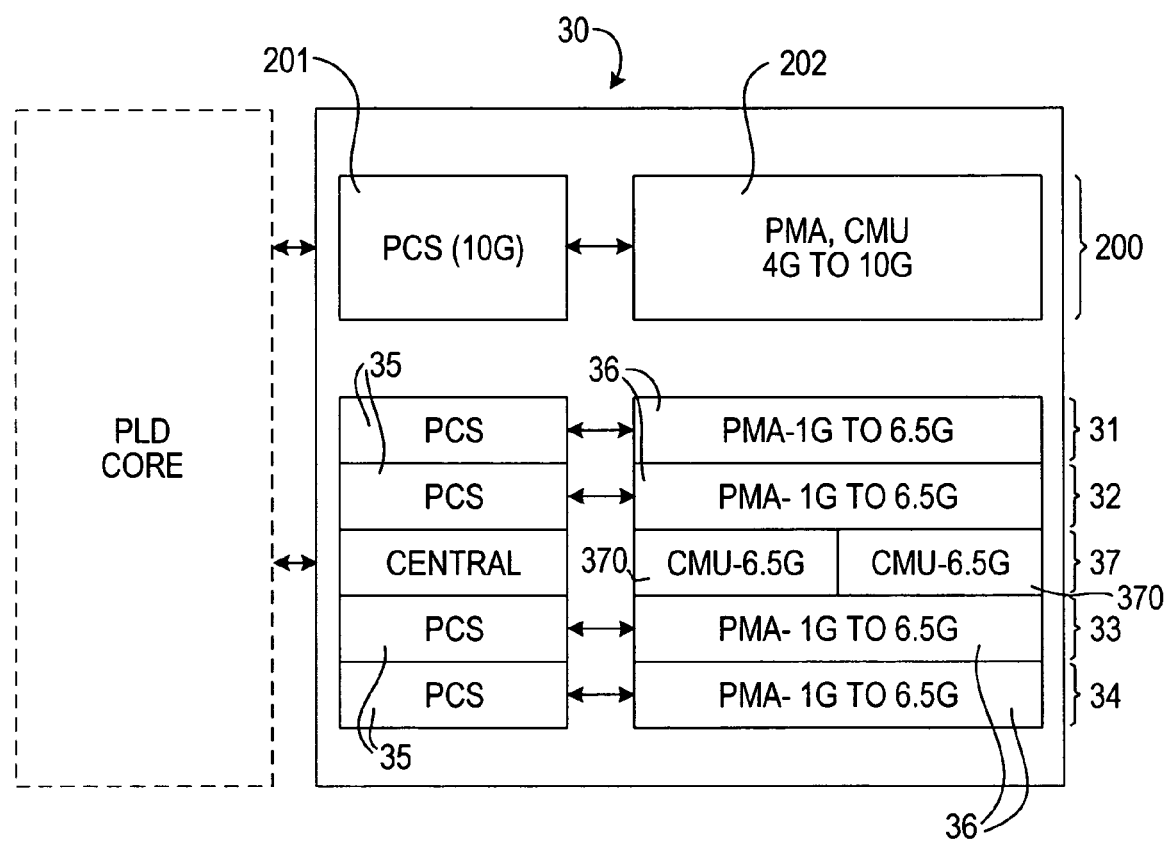
FIG. 3 is a schematic diagram of a second embodiment of a serial interface in accordance with the present invention.

Indeed, FIG. 3 shows a second preferred embodiment of an interface 30 according to the present invention, which preferably includes four channels 31-34, each preferably including its own PCS module 35 and PMA module 36. Central logic 37, preferably including at least one clock management unit 370 (in the embodiment shown, two), preferably is shared by channels 31-34. In the embodiment shown, each of channels 31-34 preferably can process data at rates between about 1 Gbps and about 6.5 Gbps, while higher-speed channel 200 in this embodiment also preferably processes data at rates between about 4 Gbps and about 10 Gbps.

Thus, in embodiment 30 there preferably is overlap between the date rate range of the lower-speed channels and the data rate range of the higher-speed channel. This allows some of the middle-range data to be processed by the more plentiful lower-speed channels instead of the scarcer higher-speed channels, leaving the higher-speed channels for the truly high-speed data. Of course, middle-range data can be processed if necessary by the higher-speed channel as well. The allocation of a lower-speed channel or a higher-speed channel to the middle-range data will depend on the needs of a particular user logic design of the PLD. In a design with many high-speed data streams as well as middle-range data streams, all of the higher speed channels may be needed for the high-speed data, but in a design with few high-speed data streams, it may be possible to use the higher-speed channels for the medium-speed data. Where both lower-speed and higher-speed channels are available for medium-speed data, the choice may depend on how many low-speed data streams there are.

In interface 30 shown in FIG. 3, the lower data rate limit in each of channels 31-34 is increased to about 1 Gbps from the about 0.6 Gbps limit of interface 20. However, it is possible to provide a lower limit of about 0.6 Gbps, or other limits, in interface 30 (or even in interface 20) at the possible cost of additional device area, or power consumption, etc.

As discussed above, in order to accommodate the wider data rate range of PMA module 36, it may be necessary to share two PCS modules 35 as in above-incorporated U.S. Pat. No. 6,888,376, or a PCS module that has two different internal paths for operating in different modes depending on the desired rate, as described in above-incorporated application Ser. No. 11/177,034, filed concurrently herewith, may be provided as PCS module 35.

As stated above, all discussion herein of particular data rates is exemplary only and does not limit the present invention, which can be implemented with other combinations of data rates than those discussed herein.

Figure 4:
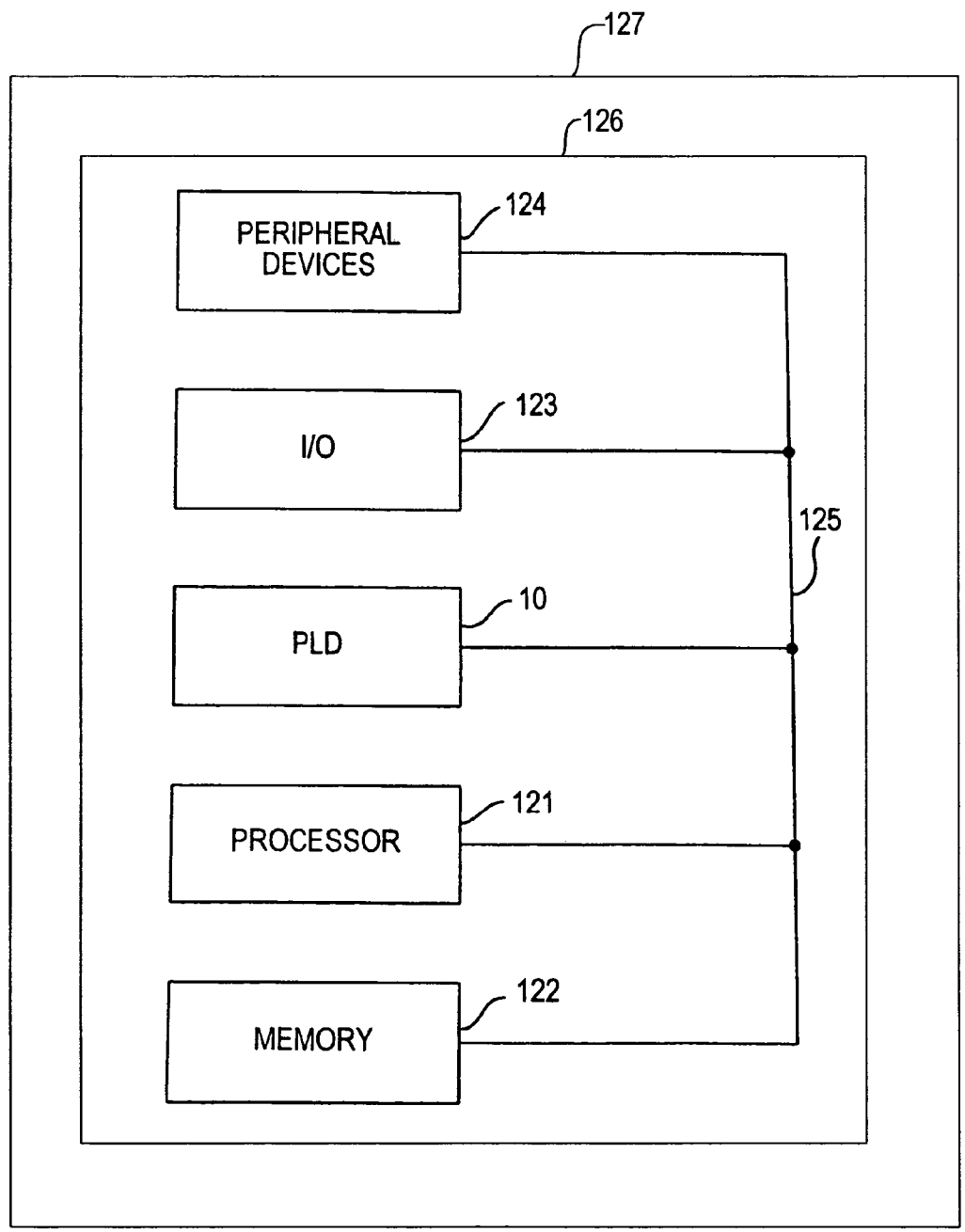
FIG. 4 is a simplified block diagram of an illustrative system employing a programmable logic device incorporating a serial interface in accordance with the present invention.

A PLD 10 incorporating interfaces 20 according to the present invention may be used in many kinds of electronic devices. One possible use is in a data processing system 120 shown in FIG. 4. Data processing system 120 may include one or more of the following components: a processor 121; memory 122; I/O circuitry 123; and peripheral devices 124. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 121. PLD 10 may also be used as an arbiter for arbitrating access to a shared resources in system 120. In yet another example, PLD 10 can be configured as an interface between processor 121 and one of the other components in system 120. It should be noted that system 120 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. An integrated circuit device comprising:
a plurality of input/output regions, at least one of said plurality of input/output regions having a serial interface, said serial interface comprising:
a plurality of serial data channels, each of said serial data channels comprising a respective physical medium attachment module; wherein:
in a first number of said serial data channels, said respective physical medium attachment module is operable solely over a first range of data rates;
in a second number of said serial data channels, said respective physical medium attachment module is operable solely over a second range of data rates; and
each of said first and second ranges has a respective maximum data rate, said maximum data rate of said second range being substantially higher than said maximum data rate of said first range.

2. The integrated circuit device of claim 1 wherein said second range of data rates is contiguous with said first range of data rates.

3. The integrated circuit device of claim 2 wherein:
said first range of data rates is between 0.6 Gbps and 4 Gbps; and
said second range of data rates is between 4 Gbps and 10 Gbps.

4. The integrated circuit device of claim 1 wherein said second range of data rates overlaps said first range of data rates.

5. The integrated circuit device of claim 4 wherein:
said first range of data rates is between 1 Gbps and 6.5 Gbps; and
said second range of data rates is between 4 Gbps and 10 Gbps.

6. The integrated circuit device of claim 1 wherein said second number is less than said first number.

7. The integrated circuit device of claim 6 wherein said second number is 1.

8. The integrated circuit device of claim 7 wherein said first number is 4.

9. The integrated circuit device of claim 1 wherein said first number is 4.

10. The integrated circuit device of claim 1 wherein each channel in said second number of channels is more isolated from others of said first and second numbers of channels than is any channel in said first number of channels.

11. The integrated circuit device of claim 1 wherein each channel in said second number of channels further includes a physical coding sublayer module and a clock management unit.

12. The integrated circuit device of claim 11 wherein:
each channel in said first number of channels includes a physical coding sublayer module; and
channels in said first number of channels share a clock management unit.

13. The integrated circuit device of claim 12 wherein all channels in said first number of channels share a single clock management unit.

14. The integrated circuit device of claim 1 wherein:
each channel in said first number of channels includes a physical coding sublayer module; and
channels in said first number of channels share a clock management unit.

15. The integrated circuit device of claim 14 wherein all channels in said first number of channels share a single clock management unit.

16. The integrated circuit device of claim 1 wherein said integrated circuit device is a programmable logic device.

17. A digital processing system comprising:
processing circuitry;
a memory coupled to said processing circuitry; and
an integrated circuit device as defined in claim 16 coupled to the processing circuitry and the memory.

18. A printed circuit board on which is mounted an integrated circuit device as defined in claim 16.

19. The printed circuit board defined in claim 18 further comprising:
memory circuitry mounted on the printed circuit board and coupled to the integrated circuit device.

20. The printed circuit board defined in claim 19 further comprising:
processing circuitry mounted on the printed circuit board and coupled to the memory circuitry.

21. A digital processing system comprising:
processing circuitry;
a memory coupled to said processing circuitry; and
an integrated circuit device as defined in claim 1 coupled to the processing circuitry and the memory.

22. A printed circuit board on which is mounted an integrated circuit device as defined in claim 1.

23. The printed circuit board defined in claim 22 further comprising:
memory circuitry mounted on the printed circuit board and coupled to the integrated circuit device.

24. The printed circuit board defined in claim 22 further comprising:
processing circuitry mounted on the printed circuit board and coupled to the memory circuitry.

* * * * *